US009142586B2

(12) United States Patent
Wang et al.

(10) Patent No.: US 9,142,586 B2
(45) Date of Patent: Sep. 22, 2015

(54) PAD DESIGN FOR BACKSIDE ILLUMINATED IMAGE SENSOR

(75) Inventors: Wen-De Wang, Minsyong Township (TW); Dun-Nian Yaung, Taipei (TW); Jen-Cheng Liu, Hsinchu (TW); Chun-Chieh Chuang, Tainan (TW); Jeng-Shyan Lin, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 1181 days.

(21) Appl. No.: 12/708,167

(22) Filed: Feb. 18, 2010

(65) Prior Publication Data
US 2010/0213560 A1 Aug. 26, 2010

Related U.S. Application Data

(60) Provisional application No. 61/154,940, filed on Feb. 24, 2009.

(51) Int. Cl.
*H01L 27/14* (2006.01)
*H01L 27/146* (2006.01)

(52) U.S. Cl.
CPC ...... *H01L 27/14636* (2013.01); *H01L 27/1464* (2013.01); *H01L 27/14621* (2013.01)

(58) Field of Classification Search
CPC .................................................. H01L 23/3677
USPC ............ 438/73, 118; 257/E21.506, 43, 257/E31.122, 700, 773, 432, E31.127, 257/E27.133, 477
See application file for complete search history.

(56) References Cited

U.S. PATENT DOCUMENTS

| 4,760,031 A | 7/1988 | Janesick |
| 4,798,958 A | 1/1989 | Janesick et al. |
| 5,332,469 A * | 7/1994 | Mastrangelo ...................... 216/2 |

(Continued)

FOREIGN PATENT DOCUMENTS

| JP | 2000-021945 | 1/2000 |
| JP | 2003-209134 | 7/2003 |

(Continued)

OTHER PUBLICATIONS

Office Action dated Apr. 3, 2012 from corresponding application No. JP2010-038812.

(Continued)

*Primary Examiner* — Yu-Hsi D Sun
*Assistant Examiner* — Ankush Singal
(74) *Attorney, Agent, or Firm* — Lowe Hauptman & Ham, LLP

(57) ABSTRACT

A semiconductor image sensor device includes first and second semiconductor substrates. A pixel array and a control circuit are formed in a first surface of the first substrate. An interconnect layer is formed over the first surface of the first substrate and electrically connects the control circuit to the pixel array. A top conducting layer is formed over the interconnect layer to have electrical connectivity with at least one of the control circuit or the pixel array via the interconnect layer. A surface of a second substrate is bonded to the top conducting layer. A conductive through-silicon-via (TSV) passes through the second substrate, and has electrical connectivity with the top conducting layer. A terminal is formed on an opposite surface of the second substrate, and electrically connected to the TSV.

20 Claims, 2 Drawing Sheets

(56) References Cited

U.S. PATENT DOCUMENTS

| | | | |
|---|---|---|---|
| 5,391,917 A | 2/1995 | Gilmour et al. | |
| 5,476,819 A * | 12/1995 | Warren | 438/456 |
| 5,510,298 A | 4/1996 | Redwine | |
| 5,536,680 A * | 7/1996 | Ehmke | 438/59 |
| 5,644,327 A * | 7/1997 | Onyskevych et al. | 345/80 |
| 5,767,001 A | 6/1998 | Bertagnolli et al. | |
| 5,998,292 A | 12/1999 | Black et al. | |
| 6,018,187 A * | 1/2000 | Theil et al. | 257/458 |
| 6,063,645 A * | 5/2000 | Tasi et al. | 438/50 |
| 6,163,352 A * | 12/2000 | Ichikawa et al. | 349/106 |
| 6,168,965 B1 | 1/2001 | Malinovich et al. | |
| 6,169,319 B1 | 1/2001 | Malinovich et al. | |
| 6,184,060 B1 | 2/2001 | Siniaguine | |
| 6,215,164 B1 * | 4/2001 | Cao et al. | 257/431 |
| 6,235,549 B1 * | 5/2001 | Bawolek et al. | 438/48 |
| 6,322,903 B1 | 11/2001 | Siniaguine et al. | |
| 6,359,290 B1 * | 3/2002 | Ehmke | 257/55 |
| 6,448,168 B1 * | 9/2002 | Rao et al. | 438/598 |
| 6,465,892 B1 | 10/2002 | Suga | |
| 6,472,293 B1 | 10/2002 | Suga | |
| 6,489,992 B2 | 12/2002 | Savoye | |
| 6,538,333 B2 | 3/2003 | Kong | |
| 6,599,778 B2 * | 7/2003 | Pogge et al. | 438/118 |
| 6,639,303 B2 | 10/2003 | Siniaguine | |
| 6,664,129 B2 | 12/2003 | Siniaguine | |
| 6,690,032 B1 * | 2/2004 | Umetsu | 257/72 |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,815,787 B1 * | 11/2004 | Yaung et al. | 257/443 |
| 6,841,883 B1 * | 1/2005 | Farnworth et al. | 257/777 |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,045,870 B2 * | 5/2006 | Wataya | 257/433 |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,089,522 B2 | 8/2006 | Tan et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,191,515 B2 * | 3/2007 | Sundahl et al. | 29/830 |
| 7,192,865 B1 * | 3/2007 | Ohtani et al. | 438/672 |
| 7,193,308 B2 | 3/2007 | Matsui | |
| 7,262,495 B2 | 8/2007 | Chen et al. | |
| 7,268,410 B1 * | 9/2007 | Hopper et al. | 257/531 |
| 7,288,481 B2 * | 10/2007 | Nemoto | 438/667 |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,365,298 B2 * | 4/2008 | Ryu | 250/208.1 |
| 7,508,072 B2 * | 3/2009 | Morita et al. | 257/737 |
| 7,588,993 B2 * | 9/2009 | Liu et al. | 438/401 |
| 7,655,495 B2 * | 2/2010 | Adkisson et al. | 438/60 |
| 7,701,023 B2 * | 4/2010 | Rieve et al. | 257/431 |
| 7,781,781 B2 * | 8/2010 | Adkisson et al. | 257/84 |
| 7,786,426 B2 * | 8/2010 | Yamashita et al. | 250/226 |
| 7,795,115 B2 * | 9/2010 | Kameyama et al. | 438/460 |
| 7,795,656 B2 * | 9/2010 | Moon | 257/294 |
| 7,808,064 B2 * | 10/2010 | Kawasaki et al. | 257/432 |
| 7,829,966 B2 * | 11/2010 | Weng et al. | 257/432 |
| 7,851,269 B2 * | 12/2010 | Muthukumar et al. | 438/125 |
| 7,851,880 B2 * | 12/2010 | Suzuki et al. | 257/448 |
| 7,859,033 B2 * | 12/2010 | Brady | 257/294 |
| 7,875,840 B2 * | 1/2011 | Jiang et al. | 250/208.1 |
| 7,964,926 B2 * | 6/2011 | Kim | 257/431 |
| 7,981,727 B2 * | 7/2011 | Liu et al. | 438/113 |
| 8,003,415 B2 * | 8/2011 | Wang et al. | 438/22 |
| 8,048,704 B2 * | 11/2011 | Smeys et al. | 438/51 |
| 8,049,256 B2 * | 11/2011 | Guidash | 257/292 |
| 8,084,798 B2 * | 12/2011 | Koike | 257/294 |
| 8,093,705 B2 * | 1/2012 | Park et al. | 257/686 |
| 8,129,811 B2 * | 3/2012 | Assefa et al. | 257/444 |
| 2004/0169248 A1 | 9/2004 | Costello et al. | |
| 2004/0245596 A1 | 12/2004 | Sugihara | |
| 2005/0029643 A1 * | 2/2005 | Koyanagi | 257/680 |
| 2005/0030403 A1 * | 2/2005 | Yaung et al. | 348/308 |
| 2005/0035381 A1 * | 2/2005 | Holm et al. | 257/290 |
| 2005/0269656 A1 * | 12/2005 | Shian-Ching et al. | 257/440 |
| 2006/0071152 A1 * | 4/2006 | Ono | 250/214.1 |
| 2006/0086956 A1 * | 4/2006 | Furukawa et al. | 257/291 |
| 2006/0138480 A1 * | 6/2006 | Adkisson et al. | 257/291 |
| 2006/0145222 A1 * | 7/2006 | Lee | 257/294 |
| 2006/0146233 A1 * | 7/2006 | Park | 349/95 |
| 2006/0170069 A1 * | 8/2006 | Kim | 257/432 |
| 2006/0278898 A1 * | 12/2006 | Shibayama | 257/228 |
| 2007/0084630 A1 * | 4/2007 | Cho | 174/262 |
| 2007/0132088 A1 * | 6/2007 | Kariya et al. | 257/698 |
| 2007/0181792 A1 * | 8/2007 | Yoshimoto et al. | 250/239 |
| 2007/0262364 A1 | 11/2007 | Hsu et al. | |
| 2008/0014673 A1 | 1/2008 | Chiang et al. | |
| 2008/0024060 A1 * | 1/2008 | Jonnalagadda et al. | 313/509 |
| 2008/0079108 A1 | 4/2008 | Hsu et al. | |
| 2008/0128848 A1 * | 6/2008 | Suzuki et al. | 257/448 |
| 2008/0169524 A1 * | 7/2008 | Kim | 257/432 |
| 2008/0191343 A1 * | 8/2008 | Liu | 257/723 |
| 2008/0224247 A1 * | 9/2008 | Hsu et al. | 257/432 |
| 2008/0237766 A1 * | 10/2008 | Kim | 257/432 |
| 2008/0265354 A1 * | 10/2008 | Wen et al. | 257/432 |
| 2008/0283950 A1 * | 11/2008 | Ryu | 257/432 |
| 2008/0284041 A1 * | 11/2008 | Jang et al. | 257/774 |
| 2008/0308890 A1 * | 12/2008 | Uya | 257/437 |
| 2009/0026563 A1 * | 1/2009 | Katsuno et al. | 257/432 |
| 2009/0032823 A1 * | 2/2009 | Im et al. | 257/80 |
| 2009/0032893 A1 * | 2/2009 | Weng et al. | 257/432 |
| 2009/0051039 A1 | 2/2009 | Kuo et al. | |
| 2009/0078973 A1 | 3/2009 | Hsu et al. | |
| 2009/0090988 A1 * | 4/2009 | Ohgishi | 257/432 |
| 2009/0134483 A1 * | 5/2009 | Weng et al. | 257/432 |
| 2009/0134485 A1 * | 5/2009 | Lee | 257/448 |
| 2009/0140365 A1 * | 6/2009 | Lee et al. | 257/460 |
| 2009/0146148 A1 * | 6/2009 | Pyo | 257/59 |
| 2009/0146325 A1 * | 6/2009 | Liu et al. | 257/797 |
| 2009/0159944 A1 * | 6/2009 | Oh | 257/292 |
| 2009/0160061 A1 | 6/2009 | Hsu et al. | |
| 2009/0184423 A1 * | 7/2009 | Erturk et al. | 257/751 |
| 2009/0224405 A1 | 9/2009 | Chiou et al. | |
| 2009/0278251 A1 * | 11/2009 | Tsai et al. | 257/700 |
| 2010/0006963 A1 * | 1/2010 | Brady | 257/432 |
| 2010/0045837 A1 * | 2/2010 | Yamashita | 348/308 |
| 2010/0109006 A1 * | 5/2010 | Kobayashi et al. | 257/48 |
| 2010/0151629 A1 * | 6/2010 | Oda et al. | 438/118 |
| 2010/0181283 A1 * | 7/2010 | Chuang et al. | 216/13 |
| 2010/0238331 A1 * | 9/2010 | Umebayashi et al. | 348/294 |
| 2010/0264548 A1 * | 10/2010 | Sanders et al. | 257/774 |
| 2011/0062540 A1 * | 3/2011 | Saito et al. | 257/432 |
| 2011/0201157 A1 * | 8/2011 | Lin et al. | 438/118 |
| 2011/0207258 A1 * | 8/2011 | Ahn et al. | 438/70 |
| 2011/0250715 A1 * | 10/2011 | Adkisson et al. | 438/57 |

FOREIGN PATENT DOCUMENTS

| | | |
|---|---|---|
| JP | 2005-209967 | 8/2005 |
| JP | 2007-013089 | 1/2007 |
| JP | 2009-016406 | 1/2009 |
| JP | 2009-016691 | 1/2009 |
| JP | 2010-050149 | 3/2010 |

OTHER PUBLICATIONS

Office Action dated Oct. 23, 2012 from corresponding application No. JP2010-038812.

* cited by examiner

PAD DESIGN FOR BACKSIDE ILLUMINATED IMAGE SENSOR

CROSS REFERENCE TO RELATED APPLICATIONS

The present application is based on, and claims priority from, U.S. Provisional Application No. 61/154,940, filed on Feb. 24, 2009, the disclosure of which is hereby incorporated by reference herein in its entirety.

The present application is related to U.S. Non-Provisional Patent Application entitled "Front Side Implanted Guard Ring Structure for Backside" bearing Ser. No. 12/710,862 which is based on, and claims priority from, U.S. Provisional Application No. 61/154,955, filed on Feb. 25, 2009. The disclosures of the above-listed applications are hereby incorporated by reference herein in their entirety.

The present application is further related to co-pending U.S. Non-Provisional Patent Applications: "Pad Structure for 3D Integrated Circuit" by Tsai et al., having Patent Application Publication No. U.S. 2009/0278251, "Through Via Process" by Chiou et al., having Patent Application Publication No. U.S. 2009/0224405 and "Through-Substrate Via for Semiconductor Device" by Kuo et al., having Patent Application Publication No. U.S. 2009/0051039, all of which are expressly incorporated by reference herein in their entirety.

BACKGROUND

The present disclosure relates generally to semiconductor devices, and more particularly, to a pad structure for backside illuminated image sensors and methods of forming same.

Image sensors provide a grid of pixels, such as photosensitive diodes or photodiodes, reset transistors, source follower transistors, pinned layer photodiodes, and/or transfer transistors, for recording an intensity or brightness of light. The pixel responds to the light by accumulating charge carriers (such as electrons and/or holes) generated when the light passes into/through a silicon layer. The more light, the more charge carriers are generated. The charge carriers are picked-up by sensors and converted into an electric signal subsequently usable by other circuits to provide color and brightness information for suitable applications, such as digital cameras. Common types of pixel grids include a charge-coupled device (CCD) or complementary metal oxide semiconductor (CMOS) image sensor (CIS) formed on a silicon semiconductor die. A semiconductor chip, when incorporated in an electronic circuit, communicates with the outside world through various input/output (I/O) pads, such as signal pads, and power/ground (P/G) pads.

FIG. 1 is a cross-sectional view of an image sensor device 100 comprising a substrate 102 sandwiched between glass layers 108 and 112. Glass layer 108 protectively covers pixel array 104, optical and filter elements 160 and an application-specific integrated circuit (ASIC) 106 formed on a semiconductor device substrate 150. A gap 151 separates the glass layer 108 from pixel array substrate 150 and optical and filter elements 160. A compositional layer 110 comprising metal multi-layer interconnect (MLI) layers M1-M3 is formed on the substrate 150. Each MLI comprises a layer containing metal traces that electrically connect portions of an MLI to another MLI. The metal traces are separated by a dielectric material 117 which is also used to form via layers between the layers. The via layers have metal vias 116 that electrically connect metal traces in different layers. An electric conductor or metal layer 119 provides an I/O interface to off chip circuitry through a side connected T-connect pad (not shown). T-connect pads connect to pad portions 120 formed in metal layer 119 formed at the edge of image sensor device 100. The pad portions 120 are separated from other pad portions 120 by dielectric material 117. Further, because the connection is made on the side of image sensor device pad portions 120 are formed at the edge of the metal layer 119, under integrated circuit (ASIC) 106, but not formed under pixel array 104.

The image sensor device 100 of FIG. 1 is fabricated using Chip Scale Packaging (CSP) to reduce the size of the device. The fabrication process includes depositing an electric conductor over the entire substrate 102. Any excess conductor is removed by planarizing the substrate 102 by, for example, a chemical-mechanical polishing (CMP) process to form pad portions 120. However, CMP is a well-known cause of low yield in the fabrication of metallic, e.g., Copper (Cu) layer 119, due to fabrication problems including dielectric erosion and metal dishing effects that might occur within a metallic surface having a large line width, thereby reducing the thickness of the Cu layer 119 and thus increasing the electrical resistance of an interconnection with external circuitry.

FIG. 2 illustrates a top view of metal layer 119 in which slits or areas 122 of dielectric material 117 are formed in through holes in the metal layer to prevent dishing, i.e., the formation of depressions or concave portions of the metal layer as a result of CMP, from occurring during CMP. However, as shown by scribe line 109, a cut edge may include a portion of a slit 122 that may provide an inadequate landing surface for a side mounted connector, resulting in poor I/O characteristics because there is very little metal of metal layer 120 exposed at the edge formed by scribe line 109. Accordingly, when forming metal layer 120 with a soft metal, such as Cu, CSP packaging usually requires forming a notch, cut along an angled scribe line 114 in substrate 102, to provide a T-connect pad with sufficient metal contact area to ensure good electrical connectivity with the metal layer.

However, although useful in obviating the problems associated with dishing, the notched slotted metal layer 120 wastes valuable wafer space, i.e., reduces otherwise usable wafer space.

DESCRIPTION OF THE DRAWINGS

Several particular embodiments will be illustrated by way of example, and not by limitation, in the figures of the accompanying drawings in which elements having the same reference numeral designations represent like elements throughout and wherein.

DETAILED DESCRIPTION

The present disclosure provides, in accordance with one or more embodiments, wafer level processing (WLP) techniques for a backside illuminated pixel sensor device that maximizes available wafer area and/or improves electrical I/O characteristics of the sensor device by using solid conductors in a conducting layer, also known as a top conducting layer, or a top metal layer, (hereinafter referred to as "TME" layer), and a through silicon via (TSV) to maximize available wafer area and improve electrical I/O characteristics of the sensor device.

Various examples of TSVs incorporated in IC chips are disclosed, for example, in U.S. Patent Application Publications Nos. 2009/0224405, US 2009/0051039, and 2009/0278251, the collective subject matter of which is hereby incorporated by reference herein in their entirety.

Figure 3:
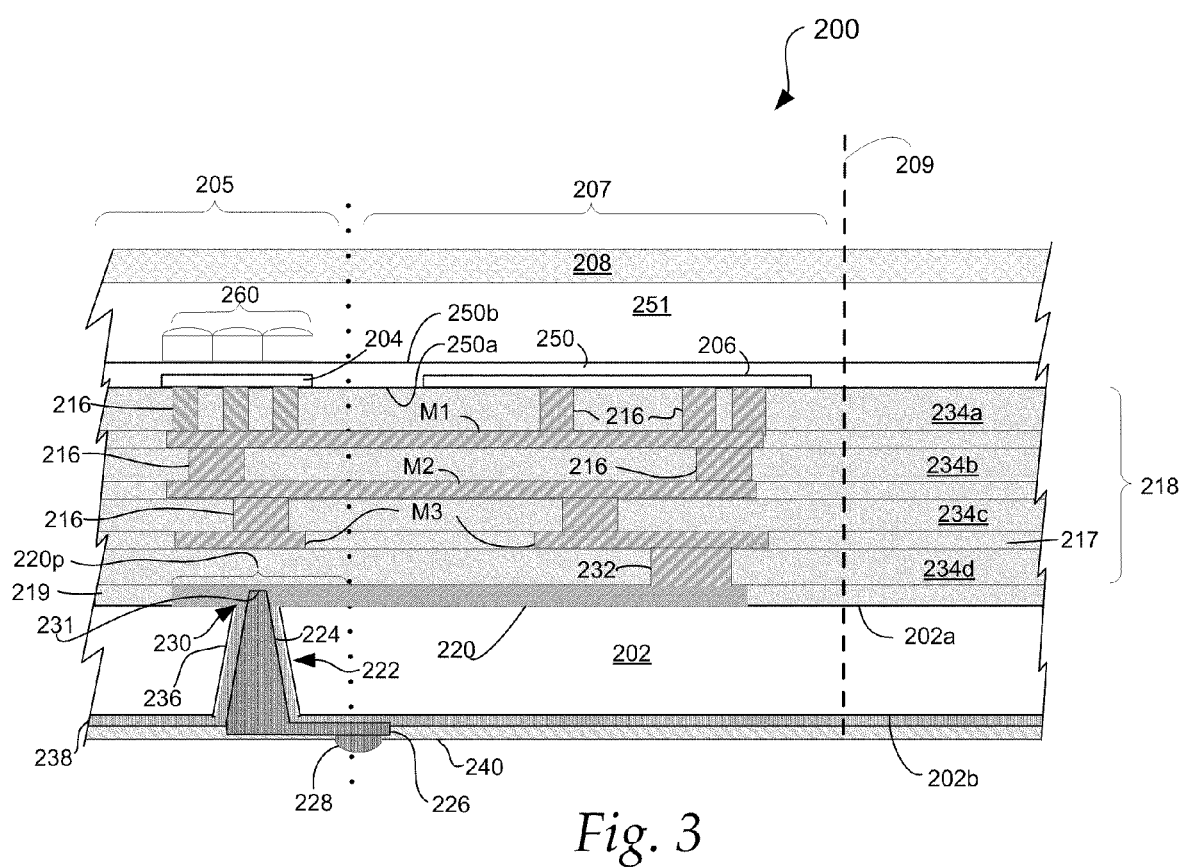
FIG. 3 is a sectional view of an image sensor device, according to an embodiment.

FIG. 3 depicts an image sensor device 200 that, according to at least one embodiment, comprises a backside illuminated CIS (CMOS Image Sensor). Image sensor device 200, in other embodiments, may comprise a CCD sensor array, or any other known or future image sensing device. Image sensor device 200 includes a semiconductor carrier substrate 202, having opposing first/upper 202a and second/bottom 202b surfaces. Image sensor device 200 further includes a semiconductor device substrate 250. The device substrate 250 includes a first side 250a (front side) and a second side 250b (backside). A first region 205 of image sensor device 200 includes a pixel array 204 formed on the first side 250a of the device substrate 250, and a second region 207 of the CIS includes a control circuit 206, e.g., an application-specific integrated circuit (ASIC), formed on the first side 250a of the device substrate 250. This disclosure does not limit the pixel array 204 and control circuit 206 to being formed on the first side 250a. In other embodiments, one or both of pixel array 204 and control circuit 206 or portions of pixel array 204 and control circuit 206 may be formed on a second side 250b. Optical and filter elements 260 are formed on the second side 250b of the device substrate 250, positioned corresponding to the pixel array 204. The second region 207 extends from the first I region 205 to an edge of the image sensor device 200, as indicated by a scribe line 209. In some embodiments, semiconductor carrier substrate 202 is formed from a silicon (Si) wafer, a germanium (Ge) wafer, and/or a silicon-germanium (SiGe) wafer, etc. Pixel array 204 and control circuit 206 are formed in a lower surface 250a of the device substrate 250.

In at least one embodiment, a multi-layer interconnect (MLI) layer 218 is formed on the first side 250a of the device substrate 250 overlying pixel array 204 and control circuit 206, and, in at least one embodiment, MLI 218 includes at least two, for example as depicted three, interconnect layers M1-M3 separated from each other and from a TME layer 219 by IMD (inter-metal dielectric) layers 234a-d. Each interconnect layer M1-M3 comprises metal traces that electrically connect portions in each metal layer M1-M3. The metal traces in each interconnect layer M1-M3 are separated by a dielectric 217 that comprises similar materials to the materials used to form IMD layers 234a-d. IMD layers 234a-d also include vias 216 that electrically connect between the metal traces different interconnect layers M1-M3. In at least one embodiment, IMD layers 234a-d comprise materials such as silicon dioxide, silicon nitride, silicon oxynitride, polyimide, spin-on glass (SOG), fluoride-doped silicate glass (FSG), carbon doped silicon oxide, BLACK DIAMOND™ (available from Applied Materials of Santa Clara, Calif.), XEROGEL™, AEROGEL™, amorphous fluorinated carbon, Parylene, BCB (bis-benzocyclobutenes), SILK™ (available from Dow Chemical of Midland, Mich.), polyimide, and/or other suitable materials. In at least one embodiment, the IMD layers are formed by a technique including spin-on, CVD, sputtering, or other suitable processes.

In some embodiments, interconnect layers M1-M3 and the vias 216 include a metal or metal alloy (e.g., Al, Cu, or Ag), a metal silicide, etc., and provide electrical connectivity between pixel array 204 and control circuit 206, as well as between control circuit 206 and TME 219. Based upon the internal and external interconnection requirements of pixel array 204 and control circuit 206, interconnect layers M1-M3 are electrically interconnected by vias 216 formed by forming via holes that pass through IMD layers 234a-c and disposing a penetrating electrode in each via hole.

Figure 1:
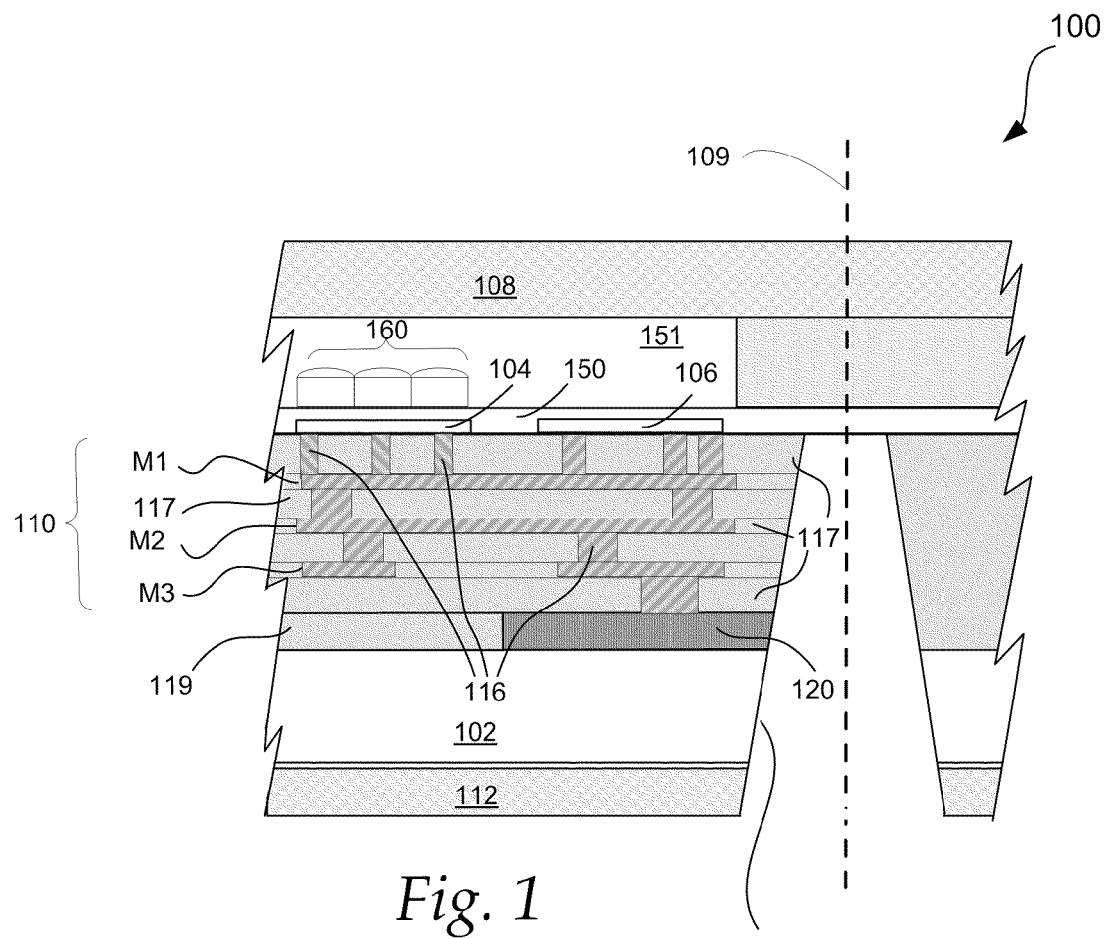
FIG. 1 is a sectional view of an image sensor device according to a related process.
Figure 2:
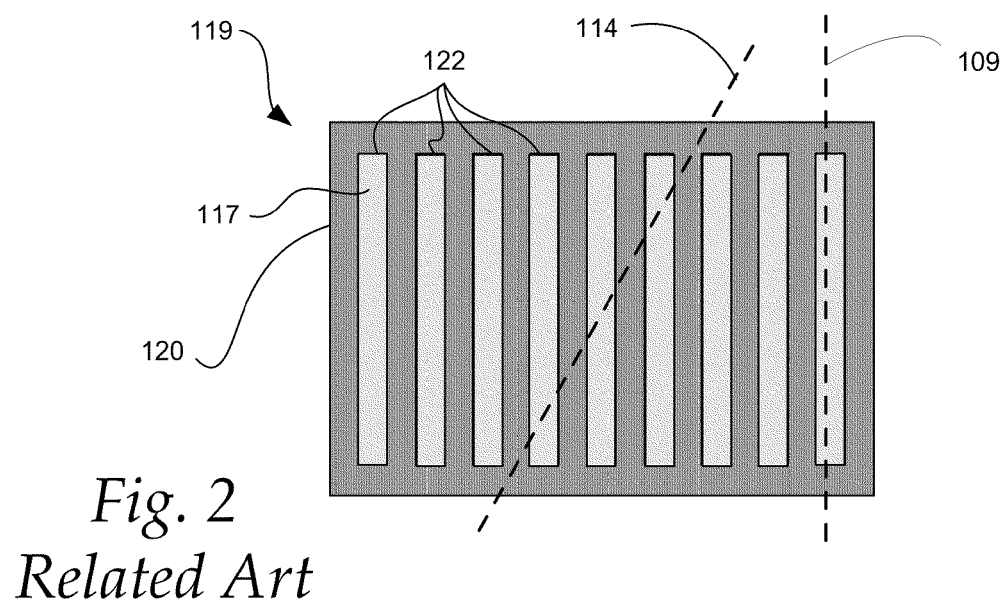
FIG. 2 is a top view of a slotted metal interconnect layer of the image sensor device of FIG. 1.

TME layer 219 is formed by depositing an electrical conductor, such as a metal or metal alloy (e.g., Al, Cu, or Ag), a metal silicide, etc., overlying IMD layer 234d. After being formed, any excess conductor of TME 219 is removed by planarizing TME layer 219 using, for example, a chemical-mechanical polishing (CMP) process. Unlike the slotted metal pad portions 120 of image sensor device 100, as depicted in FIG. 1, TME layer 219 has solid pad portions 220 without any through holes formed of a solid layer of electrical conductor that extends from the second region 207 into the first region 205, and the extending portion of pad portion 220 in the first region 205 serves as a solid pad 220p. Pad portions 220 of TME layer 219 are separated by dielectric of similar material to IMD layers 234a-d. Because any pad portions 220 formed in the TME layer 219 are no longer used for the side mounted connector, the pad portions 220 in the TME 219 need not be large. These metal areas need only be large enough to connect between (i) any through silicon vias that are described below and (ii) connections to interconnect layer M3 through, for example, a via 232 that passes through IMD layer 234d. Therefore, the CMP and yield issues associated with the side mounted connector in the related art are avoided or at least minimized.

In some embodiments, TME layer 219 routes electrical signals, i.e., I/O signals, power and ground, from control circuit 206 to a respective terminal 228 by means of respective TSVs 222 formed in the carrier substrate 202 within the first region 205. For sake of simplicity, only one terminal 228 and the associated TSV 222 are illustrated in FIG. 3. Because the side mounted connector is no longer used, the terminal(s) 228 no longer need to be near the edge of the image sensor device 200 but may be placed anywhere on the surface 202b. Thus, the terminal(s) 228 are able to be formed either under the first vertical region 205 or the second region 207. In some embodiments, the TSV(s) 222 is/are formed in the first region 205. Forming the TSV(s) 222 in the first region 205 leaves more space in the second region 207 for the terminals 228, and thus the image sensor device 200 when packaged is not much larger than the image sensor device 200 prior to packaging.

The carrier substrate 202 is wafer-bonded to the TME layer 219 after the formation of the TME layer 219 is completed. In some embodiments, before the carrier substrate 202 is bonded to TME layer 219, an insulating layer is formed from silicon oxide or silicon nitride on the surface of TME layer 219. This insulating layer prevents electrical connection between TME layer 219 and carrier substrate 202. In other embodiments, this insulating layer is formed on carrier substrate 202 before bonding or insulating layers are formed on both TME layer 219 and carrier substrate 202 before bonding the carrier substrate 202 to TME layer 219.

TSV 222 is formed in the first region 205 after wafer bonding and includes an electrode 224 passing through a via hole 236, which passes through carrier substrate 202. Image sensor device 200 includes a conductive re-routing layer 226 formed on the lower surface 202b of carrier substrate 202 for providing electrical connectivity to terminal 228. In some embodiments, conductive re-routing layer 226 is optional.

As illustrated in FIG. 3, in some embodiments, there is no direct electric path within region 205 and between (i) components in region 205 and (ii) TME layer 219 formed within the region 205. This is because, in some embodiments, all of the signals and power are routed to the second vertical region without using the TME layer 219 within the first region 205. In other words, electrical connectivity to, or from, pixel array 204 with TME layer 219 is completed in the second region 207. In at least some embodiments, electrical connectivity to/from pixel array 204 and TME 219 is completed exclusively/wholly within second region 207. Stated another way, in at least some embodiments, there is no direct electric path wholly within region 205 between (i) components in region 205 and (ii) TME 219 formed within the region 205.

FIG. 3 illustrates an embodiment wherein via hole 236 penetrates through semiconductor carrier substrate 202 and at least a portion 230 of TME 219. Furthermore, in at least one embodiment, via hole 236 is formed with a tapered shape (i.e., with a decreasing cross-section as a function of vertical extension). In further embodiments, via hole 236 is alternatively formed with a substantially constant cross-section.

In some embodiments, via hole 236 is formed using laser drilling. However, in at least one alternate embodiment, via hole 236 is formed using a dry etching process, wherein an etching mask is first formed on the bottom surface 202b of carrier substrate 202 to define an opening of via hole 236. Dry etching is then performed using the etching mask to protect semiconductor carrier substrate 202 around the opening. Further, in another alternate embodiment, via hole 236 is formed using a wet etching process.

A spacer insulation layer 238 is formed over the lower surface 202b of carrier substrate 202, including side walls and a bottom of via hole 236 after via hole 236 has been formed. In some embodiments, insulation layer 238 may be formed from silicon oxide or silicon nitride. In some embodiments, insulation layer 238 is formed using chemical vapor deposition (CVD) or spin coating.

The insulation layer 238 is then etched at the bottom of the via hole 236, at 231, to expose the pad portions 220 in TME layer 219. For this purpose, any known or future-developed patterning and etching technique may be used.

In an alternative embodiment, via hole 236 is formed along with the insulation layer 238 before the carrier substrate 202 is bonded to TME 219. In this embodiment, the via hole 236 is formed partially through the carrier substrate 202, followed by the formation of insulation layer 238. The carrier substrate 202 is then thinned from the surface 202a to open the via hole 236 and remove any insulation layer 238 at the bottom of the via hole 236. Subsequently, the substrate 202 is bonded to TME 219.

In one embodiment, electrode 224 is formed using an Aluminum (Al) physical vapor deposition (PVD) deposition method. In other embodiments, electrode 224 is formed by first plating the exposed inner surfaces of the insulation layer 238 in via hole 236 with a seed layer of Cu, and thereafter filling (or partially filing) via hole 236 with one or more conductive materials. The conductive material used to form electrode 224 may comprise a metal (or metal alloy) such as aluminum (Al) or copper (Cu) and/or a metal silicide, etc.

In some embodiments, electrode 224 completely fills the via hole 236 and connects with TME 220. In other embodiments, the electrode 224 covers the surface of insulation layer 238 and connects with TME 219. Further, in some embodiments, electrode 224 includes one or more barrier layers associated with a particular conductive material. The barrier layer(s) and/or conductive layer(s) may be additionally patterned to form re-routing layer 226 on insulation layer 238 formed on the lower surface 202b of semiconductor carrier substrate 202. The re-routing layer 226 may serve as a lateral re-distribution portion of electrode 224, allowing conductive terminal 228 to be placed some distance from via hole 236.

In some embodiments, a separate insulation layer 240 is formed on lower surface 202b of carrier substrate 202 over spacer insulation layer 238 (where present) and exposed portions (e.g., re-routing layer 226) of electrode 224. In some embodiments, insulation layer 240 is formed using chemical vapor deposition (CVD) or spin coating. One or more openings will typically be formed in insulation layer 240 to allow electrical connection of electrode 224 with terminal 228. In the embodiment of FIG. 3, terminal 228 is shown as a solder bump or a solder ball. However, terminal 228 may have any suitable geometry and may be fabricated using any one of a number of techniques.

In at least one embodiment, an opening (not shown) in insulation layer 240 that allows connection of re-routing layer 226 to terminal 228 is laterally disposed along re-routing layer 226 of electrode 224. However, in other embodiments, the opening is disposed such that terminal 228 is disposed directly under (i.e., in vertical alignment with) electrode 224. In such embodiments, re-routing layer 226 may be omitted.

In some embodiments, a covering layer 208 is formed above semiconductor device substrate 250, and is formed from a transparent material such as glass in order to facilitate the transmission of incident light to pixel array 204. In some embodiments, a gap 251 is formed between covering layer 208 semiconductor and device substrate 250. In other embodiments, a guard ring structure (not shown), is embedded in semiconductor device substrate 250 directly over pixel array 204 to reduce crosstalk, i.e., scattering of light or charge carriers among neighboring pixels of pixel array 204.

Whether embodied in a system or a semiconductor package, the disclosed image sensor device 200 in one or more embodiments provides improved I/O terminal characteristics and/or helps minimize wafer area that may be wasted due to known CSP processes.

What is claimed is:

1. An image sensor device, comprising:
   a device substrate having a pixel region and a circuit region, wherein the pixel region comprises a photo-detection region;
   a pixel array formed on the device substrate and within the pixel region;
   a control circuit formed on the device substrate and within the circuit region;
   an interconnect structure formed over the pixel array and the control circuit, the interconnect structure electrically connecting the control circuit to the pixel array;
   a conducting layer formed on the interconnect structure;
   a carrier substrate overlying the conducting layer; and
   a conductive via passing through the carrier substrate entirely within the photo-detection region, electrically connected to the conducting layer and at least partially embedded in the conducting layer,
   wherein the conducting layer comprises a portion formed in the pixel region, the portion serving as a pad.

2. The image sensor device of claim 1, wherein the pad is solid.

3. The image sensor device of claim 1, further comprising an insulation layer surrounding a sidewall of the conductive via.

4. The image sensor device of claim 1, wherein the image sensor device is a backside illuminated image sensor device.

5. The image sensor device of claim 4, wherein the device substrate has a front side and a backside, and the pixel array is formed on the front side of the device substrate.

6. The image sensor device of claim 5, further comprising a filter element on the backside of the device substrate.

7. The image sensor device of claim 1, wherein the conductive via has a constant width.

8. The image sensor device of claim 1, further comprising a re-routing layer electrically connected to the conductive via at a location in the pixel region.

9. The image sensor device of claim 8, wherein the re-routing layer includes a portion within the circuit region.

10. An image sensor device, comprising:
- a device substrate having a pixel region and a circuit region, wherein the pixel region comprises a photo-detection region;
- a pixel array formed on the device substrate within the pixel region;
- a control circuit formed on the device substrate within the circuit region;
- an interconnect structure formed over the pixel array and the control circuit, electrically connecting the control circuit to the pixel array;
- a conducting layer formed on the interconnect structure;
- a carrier substrate overlying the conducting layer;
- a conductive via, located in the photo-detection region, passing through the carrier substrate, electrically connected to the conducting layer and at least partially embedded in the conducting layer; and
- a re-routing layer electrically connected to the conductive via at a location within the pixel region,
- wherein the conducting layer comprises a solid portion formed in the pixel region, serving as a pad.

11. The image sensor device of claim 10, further comprising an insulation layer surrounding a sidewall of the conductive via.

12. The image sensor device of claim 10, wherein the device substrate has a front side and a backside, the image sensor device is illuminated from the backside and the pixel array is formed on the front side of the device substrate.

13. The image sensor device of claim 10, wherein the conductive via has a constant width.

14. The image sensor device of claim 10, wherein the conductive via has a tapered width.

15. A method of fabricating a semiconductor image sensor device, said method comprising:
- forming a pixel array on a device substrate the pixel array defining a pixel region of the device substrate, wherein the pixel region comprises a photo-detection region;
- forming a control circuit on the device substrate the control circuit defining a circuit region of the device substrate;
- forming an interconnect structure over the pixel array and the control circuit, electrically connecting the control circuit to the pixel array;
- bonding a carrier substrate to a conducting layer;
- forming a conductive via passing through the carrier substrate entirely within the photo-detection region that is electrically connected to the conducting layer and at least partially embedded in the conducting layer; and
- forming the conducting layer on the interconnect structure;
- wherein the conducting layer comprises a portion formed in the pixel region, serving as a pad.

16. The method of claim 15, wherein the pad is formed of a solid conductor.

17. The method of claim 15, wherein the conductive via is formed over the pad.

18. The method of claim 15, wherein an insulation layer is formed on a sidewall of the conductive via.

19. The method of claim 15, wherein the device substrate has a front side and a backside, the image sensor device is illuminated from the backside and the pixel array is formed on the front side of the device substrate.

20. The image sensor device of claim 10, wherein the re-routing layer includes a portion within the circuit region.

* * * * *